(12) United States Patent
Wang et al.

(10) Patent No.: US 7,943,961 B2
(45) Date of Patent: May 17, 2011

(54) STRAIN BARS IN STRESSED LAYERS OF MOS DEVICES

(75) Inventors: Yen-Sen Wang, Hsin-Chu (TW); Chung-Te Lin, Tainan (TW); Min Cao, Hsin-Chu (TW); Sheng-Jier Yang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 412 days.

(21) Appl. No.: 12/048,135

(22) Filed: Mar. 13, 2008

(65) Prior Publication Data

US 2009/0230439 A1 Sep. 17, 2009

(51) Int. Cl.
*H01L 23/48* (2006.01)
(52) U.S. Cl. ........ 257/178; 257/401; 257/669; 257/670; 257/E29.193
(58) Field of Classification Search .................. 257/401, 257/178, 669, 670, E29.193
See application file for complete search history.

(56) References Cited

U.S. PATENT DOCUMENTS

| | | | |
|---|---|---|---|
| 4,069,094 A | 1/1978 | Shaw et al. |
| 4,314,269 A | 2/1982 | Fujiki |
| 4,497,683 A | 2/1985 | Celler et al. |
| 4,631,803 A | 12/1986 | Hunter et al. |
| 4,892,614 A | 1/1990 | Chapman et al. |
| 4,946,799 A | 8/1990 | Blake et al. |
| 4,952,993 A | 8/1990 | Okumura |
| 5,130,773 A | 7/1992 | Tsukada |
| 5,155,571 A | 10/1992 | Wang et al. |
| 5,273,915 A | 12/1993 | Hwang et al. |
| 5,338,960 A | 8/1994 | Beasom |
| 5,378,919 A | 1/1995 | Ochiai |
| 5,447,884 A | 9/1995 | Fahey et al. |
| 5,461,250 A | 10/1995 | Burghartz et al. |
| 5,479,033 A | 12/1995 | Baca et al. |
| 5,525,828 A | 6/1996 | Bassous et al. |
| 5,534,713 A | 7/1996 | Ismail et al. |
| 5,596,529 A | 1/1997 | Noda et al. |
| 5,629,544 A | 5/1997 | Voldman et al. |
| 5,656,524 A | 8/1997 | Eklund et al. |
| 5,708,288 A | 1/1998 | Quigley et al. |
| 5,714,777 A | 2/1998 | Ismail et al. |

(Continued)

FOREIGN PATENT DOCUMENTS

EP 0 683 522 A2 11/1995

(Continued)

OTHER PUBLICATIONS

Grudowski, P., et al., "1-D and 2-D Geometry Effects in Uniaxially-Strained Dual Etch Stop Layer Stressor Integrations," 2006 Symposium on VLSI Technology Digest of Technical Papers, IEEE, 2006, 2 pages.

(Continued)

*Primary Examiner* — Long K Tran
(74) *Attorney, Agent, or Firm* — Slater & Matsil, L.L.P.

(57) ABSTRACT

A semiconductor structure includes an active region; a gate strip overlying the active region; and a metal-oxide-semiconductor (MOS) device. A portion of the gate strip forms a gate of the MOS device. A portion of the active region forms a source/drain region of the MOS device. The semiconductor structure further includes a stressor region over the MOS device; and a stressor-free region inside the stressor region and outside the region over the active region.

19 Claims, 11 Drawing Sheets

U.S. PATENT DOCUMENTS

| | | | |
|---|---|---|---|
| 5,763,315 | A | 6/1998 | Benedict et al. |
| 5,783,850 | A | 7/1998 | Liau et al. |
| 5,789,807 | A | 8/1998 | Correale, Jr. |
| 5,811,857 | A | 9/1998 | Assaderaghi et al. |
| 5,936,276 | A | 8/1999 | Maurelli et al. |
| 5,955,766 | A | 9/1999 | Ibi et al. |
| 5,965,917 | A | 10/1999 | Maszara et al. |
| 5,972,722 | A | 10/1999 | Visokay et al. |
| 6,008,095 | A | 12/1999 | Gardner et al. |
| 6,015,993 | A | 1/2000 | Voldman et al. |
| 6,027,988 | A | 2/2000 | Cheung et al. |
| 6,046,487 | A | 4/2000 | Benedict et al. |
| 6,059,895 | A | 5/2000 | Chu et al. |
| 6,096,591 | A | 8/2000 | Gardner et al. |
| 6,100,153 | A | 8/2000 | Nowak et al. |
| 6,100,204 | A | 8/2000 | Gardner et al. |
| 6,103,599 | A | 8/2000 | Henley et al. |
| 6,107,125 | A | 8/2000 | Jaso et al. |
| 6,111,267 | A | 8/2000 | Fischer et al. |
| 6,190,996 | B1 | 2/2001 | Mouli et al. |
| 6,222,234 | B1 | 4/2001 | Imai |
| 6,232,163 | B1 | 5/2001 | Voldman et al. |
| 6,256,239 | B1 | 7/2001 | Akita et al. |
| 6,258,664 | B1 | 7/2001 | Reinberg |
| 6,281,059 | B1 | 8/2001 | Cheng et al. |
| 6,291,321 | B1 | 9/2001 | Fitzgerald |
| 6,294,834 | B1 | 9/2001 | Yeh et al. |
| 6,303,479 | B1 | 10/2001 | Snyder |
| 6,339,232 | B1 | 1/2002 | Takagi |
| 6,358,791 | B1 | 3/2002 | Hsu et al. |
| 6,387,739 | B1 | 5/2002 | Smith, III |
| 6,396,137 | B1 | 5/2002 | Klughart |
| 6,396,506 | B1 | 5/2002 | Hoshino et al. |
| 6,407,406 | B1 | 6/2002 | Tezuka |
| 6,413,802 | B1 | 7/2002 | Hu et al. |
| 6,414,355 | B1 | 7/2002 | An et al. |
| 6,420,218 | B1 | 7/2002 | Yu |
| 6,420,264 | B1 | 7/2002 | Talwar et al. |
| 6,429,061 | B1 | 8/2002 | Rim |
| 6,433,382 | B1 | 8/2002 | Orlowski et al. |
| 6,448,114 | B1 | 9/2002 | An et al. |
| 6,448,613 | B1 | 9/2002 | Yu |
| 6,475,838 | B1 | 11/2002 | Bryant et al. |
| 6,475,869 | B1 | 11/2002 | Yu |
| 6,489,215 | B2 | 12/2002 | Mouli et al. |
| 6,489,664 | B2 | 12/2002 | Re et al. |
| 6,489,684 | B1 | 12/2002 | Chen et al. |
| 6,495,900 | B1 | 12/2002 | Mouli et al. |
| 6,498,359 | B2 | 12/2002 | Schmidt et al. |
| 6,518,610 | B2 | 2/2003 | Yang et al. |
| 6,521,952 | B1 | 2/2003 | Ker et al. |
| 6,524,905 | B2 | 2/2003 | Yamamichi et al. |
| 6,525,403 | B2 | 2/2003 | Inaba et al. |
| 6,541,343 | B1 | 4/2003 | Murthy et al. |
| 6,555,839 | B2 | 4/2003 | Fitzgerald |
| 6,558,998 | B2 | 5/2003 | Belleville et al. |
| 6,573,172 | B1 | 6/2003 | En et al. |
| 6,576,526 | B2 | 6/2003 | Kai et al. |
| 6,586,311 | B2 | 7/2003 | Wu |
| 6,600,170 | B1 | 7/2003 | Xiang |
| 6,617,643 | B1 | 9/2003 | Goodwin-Johansson |
| 6,621,131 | B2 | 9/2003 | Murthy et al. |
| 6,633,070 | B2 | 10/2003 | Miura et al. |
| 6,646,322 | B2 | 11/2003 | Fitzgerald |
| 6,653,700 | B2 | 11/2003 | Chau et al. |
| 6,657,259 | B2 | 12/2003 | Fried et al. |
| 6,657,276 | B1 | 12/2003 | Karlsson et al. |
| 6,674,100 | B2 | 1/2004 | Kubo et al. |
| 6,686,247 | B1 | 2/2004 | Bohr |
| 6,690,082 | B2 | 2/2004 | Lakshmikumar |
| 6,720,619 | B1 | 4/2004 | Chen et al. |
| 6,724,019 | B2 | 4/2004 | Oda et al. |
| 6,734,527 | B1 | 5/2004 | Xiang |
| 6,737,710 | B2 | 5/2004 | Cheng et al. |
| 6,740,535 | B2 | 5/2004 | Singh et al. |
| 6,759,717 | B2 | 7/2004 | Sagarwala et al. |
| 6,762,448 | B1 | 7/2004 | Lin et al. |
| 6,784,101 | B1 | 8/2004 | Yu et al. |
| 6,794,764 | B1 | 9/2004 | Kamal et al. |
| 6,797,556 | B2 | 9/2004 | Murthy et al. |
| 6,798,021 | B2 | 9/2004 | Ipposhi et al. |
| 6,803,641 | B2 | 10/2004 | Papa Rao et al. |
| 6,812,103 | B2 | 11/2004 | Wang et al. |
| 6,815,288 | B2 | 11/2004 | Kim |
| 6,821,840 | B2 | 11/2004 | Wieczorek et al. |
| 6,830,962 | B1 | 12/2004 | Guarini et al. |
| 6,861,318 | B2 | 3/2005 | Murthy et al. |
| 6,867,101 | B1 | 3/2005 | Yu |
| 6,867,433 | B2 | 3/2005 | Yeo et al. |
| 6,872,610 | B1 | 3/2005 | Mansoori et al. |
| 6,882,025 | B2 | 4/2005 | Yeo et al. |
| 6,885,084 | B2 | 4/2005 | Murthy et al. |
| 6,891,192 | B2 | 5/2005 | Chen et al. |
| 6,900,502 | B2 | 5/2005 | Ge et al. |
| 6,924,181 | B2 | 8/2005 | Huang et al. |
| 6,936,506 | B1 | 8/2005 | Buller et al. |
| 6,936,881 | B2 | 8/2005 | Yeo et al. |
| 6,939,814 | B2 | 9/2005 | Chan et al. |
| 6,940,705 | B2 | 9/2005 | Yeo et al. |
| 6,969,618 | B2 | 11/2005 | Mouli |
| 6,982,433 | B2 | 1/2006 | Hoffman et al. |
| 6,998,311 | B2 | 2/2006 | Forbes et al. |
| 7,029,994 | B2 | 4/2006 | Ge et al. |
| 7,052,964 | B2 | 5/2006 | Yeo et al. |
| 7,071,052 | B2 | 7/2006 | Yeo et al. |
| 7,081,395 | B2 | 7/2006 | Chi et al. |
| 7,101,742 | B2 | 9/2006 | Ko et al. |
| 7,112,495 | B2 | 9/2006 | Ko et al. |
| 7,164,163 | B2 | 1/2007 | Chen et al. |
| 7,193,269 | B2 | 3/2007 | Toda et al. |
| 7,220,630 | B2 | 5/2007 | Cheng et al. |
| 7,268,024 | B2 | 9/2007 | Yeo et al. |
| 7,303,955 | B2 | 12/2007 | Kim |
| 7,354,843 | B2 | 4/2008 | Yeo et al. |
| 7,442,967 | B2 | 10/2008 | Ko et al. |
| 7,528,028 | B2 * | 5/2009 | Liang et al. .................. 438/199 |
| 2001/0028089 | A1 | 10/2001 | Adan |
| 2002/0008289 | A1 | 1/2002 | Murota et al. |
| 2002/0031890 | A1 | 3/2002 | Watanabe et al. |
| 2002/0045318 | A1 | 4/2002 | Chen et al. |
| 2002/0074598 | A1 | 6/2002 | Doyle et al. |
| 2002/0076899 | A1 | 6/2002 | Skotnicki et al. |
| 2002/0125471 | A1 | 9/2002 | Fitzgerald et al. |
| 2002/0140031 | A1 | 10/2002 | Rim |
| 2002/0153549 | A1 | 10/2002 | Laibowitz et al. |
| 2002/0163036 | A1 | 11/2002 | Miura et al. |
| 2002/0190284 | A1 | 12/2002 | Murthy et al. |
| 2003/0001219 | A1 | 1/2003 | Chau et al. |
| 2003/0030091 | A1 | 2/2003 | Bulsara et al. |
| 2003/0080361 | A1 | 5/2003 | Murthy et al. |
| 2003/0080386 | A1 | 5/2003 | Ker et al. |
| 2003/0080388 | A1 | 5/2003 | Disney et al. |
| 2003/0098479 | A1 | 5/2003 | Murthy et al. |
| 2003/0136985 | A1 | 7/2003 | Murthy et al. |
| 2003/0162348 | A1 | 8/2003 | Yeo et al. |
| 2003/0183880 | A1 | 10/2003 | Goto et al. |
| 2003/0227013 | A1 | 12/2003 | Currie et al. |
| 2004/0016972 | A1 | 1/2004 | Singh et al. |
| 2004/0018668 | A1 | 1/2004 | Maszara |
| 2004/0026765 | A1 | 2/2004 | Currie et al. |
| 2004/0029323 | A1 | 2/2004 | Shimizu et al. |
| 2004/0063300 | A1 | 4/2004 | Chi |
| 2004/0070035 | A1 | 4/2004 | Murthy et al. |
| 2004/0087098 | A1 | 5/2004 | Ng et al. |
| 2004/0104405 | A1 | 6/2004 | Huang et al. |
| 2004/0108598 | A1 | 6/2004 | Cabral, Jr. et al. |
| 2004/0129982 | A1 | 7/2004 | Oda et al. |
| 2004/0140506 | A1 | 7/2004 | Singh et al. |
| 2004/0173815 | A1 | 9/2004 | Yeo et al. |
| 2004/0179391 | A1 | 9/2004 | Bhattacharyya |
| 2004/0217448 | A1 | 11/2004 | Kumagai et al. |
| 2004/0262683 | A1 | 12/2004 | Bohr et al. |
| 2004/0266116 | A1 | 12/2004 | Mears et al. |
| 2005/0012087 | A1 | 1/2005 | Sheu et al. |
| 2005/0029601 | A1 | 2/2005 | Chen et al. |
| 2005/0035369 | A1 | 2/2005 | Lin et al. |
| 2005/0035410 | A1 | 2/2005 | Yeo et al. |

| | | |
|---|---|---|
| 2005/0082522 A1 | 4/2005 | Huang et al. |
| 2005/0093078 A1 | 5/2005 | Chan et al. |
| 2005/0136584 A1 | 6/2005 | Boyanov et al. |
| 2005/0186722 A1 | 8/2005 | Cheng et al. |
| 2005/0224986 A1 | 10/2005 | Tseng et al. |
| 2005/0224988 A1 | 10/2005 | Tuominen |
| 2005/0236694 A1 | 10/2005 | Wu et al. |
| 2005/0266632 A1 | 12/2005 | Chen et al. |
| 2005/0269650 A1 | 12/2005 | Pidin |
| 2006/0001073 A1 | 1/2006 | Chen et al. |
| 2006/0121727 A1 | 6/2006 | Metz et al. |
| 2007/0040225 A1 | 2/2007 | Yang |
| 2007/0267680 A1 | 11/2007 | Uchino et al. |
| 2008/0169484 A1 | 7/2008 | Chuang et al. |
| 2008/0296695 A1* | 12/2008 | Yang ............................ 257/371 |
| 2009/0230439 A1 | 9/2009 | Wang et al. |
| 2010/0078725 A1 | 4/2010 | Hou et al. |

FOREIGN PATENT DOCUMENTS

| | | |
|---|---|---|
| EP | 0 828 296 A2 | 3/1998 |
| WO | WO-03/017336 A2 | 2/2003 |

OTHER PUBLICATIONS

Uejima, K., et al., "Highly Efficient Stress Transfer Techniques in Dual Stress Liner CMOS Integration," 2007 Symposium on VLSI Technology Digest of Technical Papers, Paper 12A-4, IEEE, 2007, pp. 220-221.

"Future Gate Stack," SEMATECH Inc., 2001 Annual Report, 2 pages.

Bednar, T. R., et al., "Issues and Strategies for the Physical Design of System-on-a-Chip ASICs," IBM Journal of Research and Development, vol. 46, No. 6, Nov. 2002, pp. 661-674.

Bianchi, R. A., et al., "Accurate Modeling of Trench Isolation Induced Mechanical Stress Effects on MOSFET Electrical Performance," IEDM, 2002, pp. 117-120.

Blaauw, D., et al., "Gate Oxide and Subthreshold Leakage Characterization, Analysis and Optimization," date unknown, 2 pages.

Cavassilas, N., et al., "Capacitance-Voltage Characteristics of Metal-Oxide-Strained Semiconductor Si/SiGe Heterostructures," Nanotech 2002, vol. 1, pp. 600-603.

Celik, M., et al., "A 45 nm Gate Length High Performance SOI Transistor for 100nm CMOS Technology Applications," 2002 Symposium on VLSI Technology Digest of Technical Papers, IEEE, pp. 166-167.

Chang, L., et al., "Direct-Tunneling Gate Leakage Current in Double-Gate and Ultrathin Body MOSFETs," IEEE Transactions on Electron Devices, vol. 49, No. 12, Dec. 2002, pp. 2288-2295.

Chang, L., et al., "Reduction of Direct-Tunneling Gate Leakage Current in Double-Gate and Ultra-Thin Body MOSFETs," IEEE, 2001, 4 pages.

Chau, R., et al., "A 50nm Depleted-Substrate CMOS Transistor (DST)," IEDM, 2001, pp. 621-624.

Chen, W., et al., "Suppression of the SOI Floating-Body Effects by Linked-Body Device Structure," 1996 Symposium on VLSI Technology Digest of Technical Papers, IEEE, pp. 92-93.

Fung, S. K. H., et al., "Gate Length Scaling Accelerated to 30nm Regime Using Ultra-Thin Film PD-SOI Technology," IEDM, 2001, pp. 629-632.

Gámiz, F., et al., "Electron Transport in Strained Si Inversion Layers Grown on SiGe-on-Insulator Substrates," Journal of Applied Physics, vol. 92, No. 1, Jul. 1, 2002, pp. 288-295.

Gámiz, F., et al., "Strained-Si/SiGe-on-Insulator Inversion Layers: The Role of Strained-Si Layer Thickness on Electron Mobility," Applied Physics Letters, vol. 80, No. 22, Jun. 3, 2002, pp. 4160-4162.

Ge, C.-H., et al., "Process-Strained Si (PSS) CMOS Technology Featuring 3D Strain Engineering," IEDM, 2003, pp. 73-76.

Geppert, L., "The Amazing Vanishing Transistor Act," IEEE Spectrum, Oct. 2002, pp. 28-33.

Ghani, T., et al., "A 90nm High Volume Manufacturing Logic Technology Featuring Novel 45nm Gate Length Strained Silicon CMOS Transistors," IEDM, 2003, pp. 978-980.

Huang, X., et al., "Sub-50 nm P-Channel FinFET," IEEE Transactions on Electron Devices, vol. 48, No. 5, May 2001, pp. 880-886.

Ismail, K., et al., "Electron Transport Properties of Si/SiGe Heterostructures: Measurements and Device Implications," Applied Physics Letters, vol. 63, No. 5, Aug. 2, 1993, pp. 660-662.

Ito, S., et al., "Mechanical Stress Effect of Etch-Stop Nitride and Its Impact on Deep Submicron Transistor Design," IEDM, 2000, pp. 247-250.

Jurczak, M., et al., "Silicon-on-Nothing (SON)—an Innovative Process for Advanced CMOS," IEEE Transactions on Electron Devices, vol. 47, No. 11, Nov. 2000, pp. 2179-2187.

Jurczak, M., et al., "SON (Silicon on Nothing)—A New Device Architecture for the ULSI Era," 1999 Symposium on VLSI Technology Digest of Technical Papers, IEEE, pp. 29-30.

Kanda, Y., "A Graphical Representation of the Piezoresistance Coefficients in Silicon," IEEE Transactions on Electron Devices, vol. Ed-29, No. 1, Jan. 1982, pp. 64-70.

Leitz, C. W., et al., "Channel Engineering of SiGe-Based Heterostructures for High Mobility MOSFETs," Materials Research Society Symposium Proceedings, vol. 686, 2002, pp. 113-118.

Leitz, C. W., et al., "Hole Mobility Enhancements in Strained Si/Si$_{1-y}$Ge$_y$ P-Type Metal-Oxide-Semiconductor Field-Effect Transistors Grown on Relaxed Si$_{1-x}$Ge$_x$ (x<y) Virtual Substrates," Applied Physics Letters, vol. 79, No. 25, Dec. 17, 2001, pp. 4246-4248.

Liu, K. C., et al., "A Novel Sidewall Strained-Si Channel nMOSFET," IEDM, 1999, pp. 63-66.

Maiti, C. K., et al., "Film Growth and Material Parameters," Application of Silicon-Germanium Heterostructure, Ch. 2, Institute of Physics Publishing, pp. 32-42.

Matthews, J. W., "Defects Associated with the Accommodation of Misfit between Crystals," The Journal of Vacuum Science and Technology, vol. 12, No. 1, Jan./Feb. 1975, pp. 126-133.

Matthews, J. W., et al., "Defects in Epitaxial Multilayers—I. Misfit Dislocations," Journal of Crystal Growth, vol. 27, 1974, pp. 118-125.

Matthews, J. W., et al., "Defects in Epitaxial Multilayers—II. Dislocation Pile-Ups, Threading Dislocations, Slip Lines and Cracks," Journal of Crystal Growth, vol. 29, 1975, pp. 273-280.

Matthews, J. W., et al., "Defects in Epitaxial Multilayers—III. Preparation of Almost Perfect Multilayers," Journal of Crystal Growth, vol. 32, 1976, pp. 265-273.

Mizuno, T., et al., "Novel SOI p-Channel MOSFETs with Higher Strain in Si Channel Using Double SiGe Heterostructures," IEEE Transactions on Electron Devices, vol. 49, No. 1, Jan. 2002, pp. 7-14.

Nayak, D. K., et al., "Enhancement-Mode Quantum-Well Ge$_x$Si$_{1-x}$ PMOS," IEEE Electron Device Letters, vol. 12, No. 4, Apr. 1991, pp. 154-156.

Ootsuka, F., et al., "A Highly Dense, High-Performance 130nm Node CMOS Technology for Large Scale System-on-a-Chip Applications," IEDM, 2000, pp. 575-578.

Ota, K., et al., "Novel Locally Strained Channel Technique for High Performance 55nm CMOS," IEDM, 2002, pp. 27-30.

Rim, K., et al., "Fabrication and Analysis of Deep Submicron Strained-Si N-MOSFET's," IEEE Transactions on Electron Devices, vol. 47, No. 7, Jul. 2000, pp. 1406-1415.

Rim, K., "Strained Si Surface Channel MOSFETs for High-Performance CMOS Technology," IEEE International Solid-State Circuits Conference, Digest of Technical Papers, 2001, pp. 116-117.

Schüppen, A., et al., "Mesa and Planar SiGe-HBTs on MBE-Wafers," Journal of Materials Science: Materials in Electronics, vol. 6, 1995, pp. 298-305.

Scott, G., et al., "NMOS Drive Current Reduction Caused by Transistor Layout and Trench Isolation Induced Stress," IEDM, 1999, pp. 827-830.

Shahidi, G. G., "SOI Technology for the GHz Era," IBM Journal of Research and Development, vol. 46, No. 2/3, Mar./May 2002, pp. 121-131.

Shimizu, A., et al., "Local Mechanical-Stress Control (LMC): A New Technique for CMOS-Performance Enhancement," IEDM, 2001, pp. 433-436.

Tezuka, T., et al., "High-Performance Strained Si-on-Insulator MOSFETs by Novel Fabrication Processes Utilizing Ge-Condensation Technique," 2002 Symposium on VLSI Technology Digest of Technical Papers, IEEE, pp. 96-97.

Thompson, S., et al., "A 90 nm Logic Technology Featuring 50nm Strained Silicon Channel Transistors, 7 Layers of Cu Interconnects, Low k ILD, and 1 um² SRAM Cell," IEDM, 2002, pp. 61-64.

Tiwari, S., et al., "Hole Mobility Improvement in Silicon-on-Insulator and Bulk Silicon Transistors Using Local Strain," IEDM, 1997, pp. 939-941.

Wang, L. K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Welser, J., et al., "NMOS and PMOS Transistors Fabricated in Strained Silicon/Relaxed Silicon-Germanium Structures," IEDM, 1992, pp. 1000-1002.

Wong, H.-S. P., "Beyond the Conventional Transistor," IBM Journal of Research and Development, vol. 46, No. 2/3, Mar./May 2002, pp. 133-167.

Yang, F.-L., et al., "25 nm CMOS Omega FETs," IEDM, 2002, pp. 255-258.

Yang, F.-L., et al., "35nm CMOS FinFETs," 2002 Symposium on VLSI Technology Digest of Technical Papers, IEEE, pp. 104-105.

Yeo, Y.-C., et al., "Enhanced Performance in Sub-100 nm CMOSFETs Using Strained Epitaxial Silicon-Germanium," IEDM, 2000, pp. 753-756.

Yeoh, J. C., et al., "MOS Gated Si:SiGe Quantum Wells Formed by Anodic Oxidation," Semiconductor Science and Technology, vol. 13, 1998, pp. 1442-1445.

Wolf, S., et al., "Silicon Processing for the VLSI Era," vol. 1: Process Technology, Second Edition, Lattice Press, Sunset Beach, CA, 2000, pp. 834-835.

Wolf, S., et al., "Silicon Processing for the VLSI Era," vol. 2: Process Integration, Lattice Press, Sunset Beach, CA, 1990, pp. 144-145.

Wolf, S., et al., "Silicon Processing for the VLSI Era," vol. 1: Process Technology, Second Edition, Lattice Press, Sunset Beach, CA, 2000, pp. 374-385.

Wolf, S., et al., "Silicon Processing for the VLSI Era," vol. 2: Process Integration, Lattice Press, Sunset Beach, CA, 1990, pp. 658-663.

* cited by examiner

STRAIN BARS IN STRESSED LAYERS OF MOS DEVICES

CROSS-REFERENCE TO RELATED APPLICATION

This application is related to commonly assigned U.S. patent application Ser. No. 11/849,798, filed Sep. 4, 2007, and entitled "Strained Transistor with Optimized Drive Current and Method of Forming," which application is incorporated herein by reference.

TECHNICAL FIELD

This invention relates generally to semiconductor devices, and more particularly to metal-oxide-semiconductor (MOS) devices, and even more particularly to improving stresses in the MOS devices.

BACKGROUND

Reductions in the size and inherent features of semiconductor devices, for example, metal-oxide semiconductor (MOS) devices, have enabled continued improvements in speed, performance, density, and cost per unit function of integrated circuits over the past few decades. In accordance with a design of the MOS device and one of the inherent characteristics thereof, modulating the length of a channel region underlying a gate between a source and a drain of a MOS device alters a resistance associated with the channel region, thereby affecting the performance of the MOS device. More specifically, shortening the length of the channel region reduces a source-to-drain resistance of the MOS device, which, assuming other parameters are maintained relatively constant, may allow for an increase in current flow between the source and drain when a sufficient voltage is applied to the gate of the MOS device.

To further enhance the performance of MOS devices, stresses may be introduced in the channel region of a MOS device to improve its carrier mobility. Generally, it is desirable to induce a tensile stress in the channel region of an n-type MOS (NMOS) device in a source-to-drain direction (channel length direction) and to induce a compressive stress in the channel region of a p-type MOS (PMOS) device in the channel length direction.

A commonly used method for applying compressive stresses to the channel regions of MOS devices is to form stressed contact etch stop layers (CESL), which apply stresses to the underlying MOS devices. Since the CESLs were existing components of MOS devices, the introduction of the stressed CESLs resulted in little, if any at all, extra manufacturing costs. For NMOS devices, the overlying CESLs need to have inherent tensile stresses, and apply tensile stresses to the channel regions. For PMOS devices, the overlying CESLs need to have inherent compressive stresses, and apply compressive stresses to the channel regions.

CESLs apply a same stress (either tensile or compressive) to the underlying MOS devices from all directions. However, a MOS device may prefer different types of stresses in different directions. For example, PMOS devices prefer compressive stresses in the channel length directions, and tensile stresses in the channel width directions. Therefore, the compressive stresses applied to the channel width directions of the PMOS devices actually degrade the performance of the PMOS devices. A new structure is provided by the present invention to address the customized stress requirements of the MOS devices.

SUMMARY OF THE INVENTION

In accordance with one aspect of the present invention, a semiconductor structure includes an active region; a gate strip overlying the active region; and a metal-oxide-semiconductor (MOS) device. A portion of the gate strip forms a gate of the MOS device. A portion of the active region forms a source/drain region of the MOS device. The semiconductor structure further includes a stressor region over the MOS device; and a stressor-free region inside the stressor region and outside the region over the active region.

In accordance with another aspect of the present invention, a semiconductor structure includes a semiconductor substrate; an active region in the semiconductor substrate; an isolation region in the semiconductor substrate and adjoining the active region; and a MOS device. The MOS device includes a gate electrode over the active region; and a source region and a drain region on opposing sides of the gate electrode, wherein the source and drain regions overlap portions of the active region. The semiconductor structure further includes a stressor layer over the active region and the isolation region; a stressor-free region encircled by the stressor layer and directly overlying the isolation region; and a first strain bar in the stressor-free region.

In accordance with yet another aspect of the present invention, a semiconductor structure includes a semiconductor substrate; an active region in the semiconductor substrate; a shallow trench isolation (STI) region in the semiconductor substrate and adjoining the active region; and a MOS device. The MOS device includes a gate electrode over the active region, and a source region and a drain region on opposing sides of the gate electrode, wherein the source and drain regions overlap portions of the active region. The semiconductor structure further includes a contact etch stop layer (CESL) over the active region and the STI region; a stressor-free region overlying the isolation region, wherein the stressor-free region is encircled by the CESL; a strain bar filling the stressor-free region; an inter-layer dielectric (ILD) over the CESL; and a contact plug in the ILD and contacting one of the source and drain regions.

In accordance with yet another aspect of the present invention, a method of forming a semiconductor structure includes providing a semiconductor substrate comprising an active region therein; providing an isolation region in the semiconductor substrate and adjoining the active region; and forming a MOS device. The step of forming the MOS device includes forming a gate electrode over the active region; and forming a source region and a drain region on opposing sides of the gate electrode. The method further includes forming a stressor layer over the active region and the isolation region; and forming a strain bar overlying the isolation region, wherein the strain bar is encircled by the stressor layer.

In accordance with yet another aspect of the present invention, a method of forming a semiconductor structure includes providing a semiconductor substrate including an active region therein; providing a STI region in the semiconductor substrate and adjoining the active region; and forming a MOS device. The step of forming the MOS device includes forming a gate electrode over the active region; and forming a source region and a drain region on opposing sides of the gate electrode. The method further includes forming a contact etch stop layer over the active region and the STI region; forming an opening in the CESL and directly overlying the STI region; and filling the opening to form a strain bar.

The advantageous features of the present invention include improved stresses applied to MOS devices, and hence improved performance of the MOS devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel stressor layers for applying stresses on metal-oxide-semiconductor (MOS) devices are presented. The manufacturing methods of the preferred embodiments are then discussed. Throughout the various views and illustrative embodiments of the present invention, like reference numbers are used to designate like elements.

Figure 1:
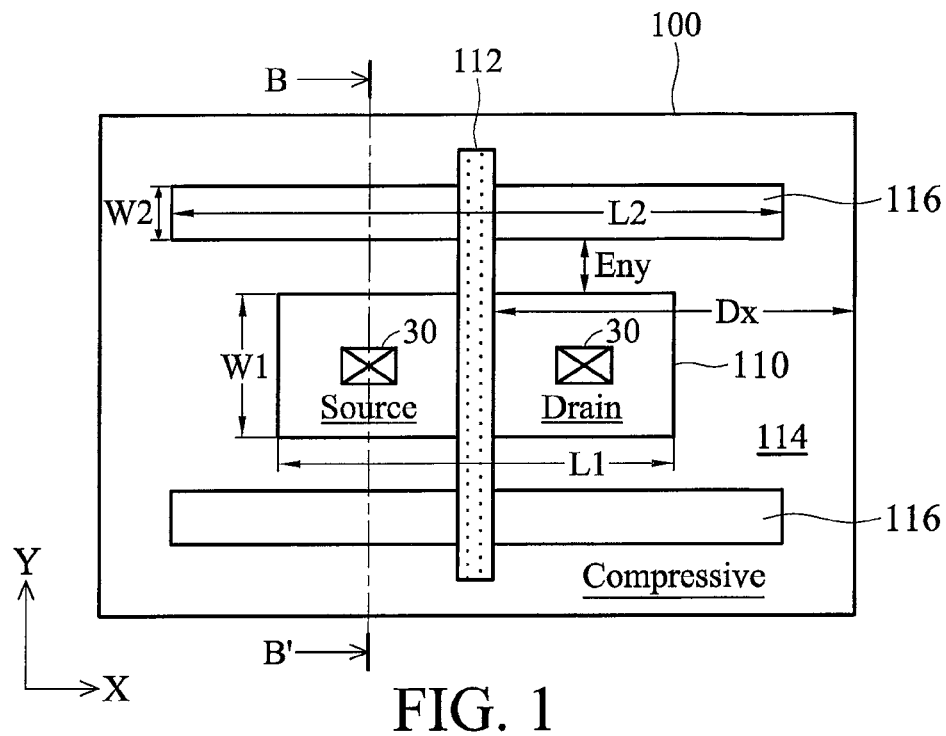
FIG. 1 illustrates strain bars formed in a compressive stressor layer over a PMOS device.

FIG. 1 illustrates a top view of an embodiment of the present invention, which illustrates PMOS device 100 and the surrounding region. PMOS device 100 includes active region 110, and poly strip 112 extending over and across active region 110. Throughout the description, the term "poly strip" is used to refer to a conductive strip formed of polysilicon or various other conductive materials, such as metals, metal silicide, metal nitrides, and the like. Active region 110 may be surrounded by insulation regions, for example, shallow trench isolation regions (STI, refer to FIG. 10). Stressor layer 114 is formed over poly strip 112 and active region 110. Stressor layer 114 may be a contact etch stop layer (CESL), or other dielectric layer(s) formed over PMOS device 100.

As is known in the art, PMOS devices prefer compressive stresses. In this embodiment, stressor layer 114 has an inherent compressive stress. Accordingly, compressive stresses are applied to PMOS device 100 in both the X direction and the Y direction. The compressive stress (both the inherent stress in stressor layer 114 and the stress applied to PMOS device 100 by stressor layer 114) in the X direction (channel length direction) is beneficial for improving the drive current of PMOS device 100, and hence is preferably preserved. The compressive stress in the Y direction (channel width direction) is detrimental for the drive current of PMOS device 100, and hence is preferably eliminated. In the preferred embodiment, two strain bars 116 are formed over the STI region (hence are outside of the active region 110), and in stressor layer 114. Strain bars 116 are formed by etching stressor layer 114 to form openings, and fill the openings with a material different from the material of stressor layer 114. Accordingly, the regions occupied by strain bars 116 are also stressor-free regions. In an embodiment, strain bars 116 are filled with an inter-layer dielectric. In other embodiments, strain bars 116 are filled with a same material as contact plugs. In yet other embodiments, strain bars 116 are filled with a material having a neutral stress (no stress), or a stress type opposite to the stress type of stressor layer 114. In yet other embodiments, strain bars 116 may even be filled with a material having a stress of a same type as, but with a magnitude less than, the stress of stressor layer 114. The materials and the formation methods of strain bars 116 are discussed in detail in subsequent paragraphs. No strain bars are formed on the left and right sides of active region 110.

Strain bars 116 advantageously cut through the strain path in Y direction, and hence reduce the detrimental inherent compressive stress in Y direction. Accordingly, the detrimental compressive stress applied to PMOS device 100 is reduced. The distance Eny, which is between strain bars 116 and the respective edge of active region 110, is thus preferably small. In the preferred embodiment, distance Eny is less than about 1 µm, and more preferably less than about 0.3 µm. When distance Eny increases, stressor layer 114 still has the effect of reducing the stress in the Y direction. However, the amount of reduction is reduced. A greater width W2 of strain bars 116 is helpful in reducing the compressive stress in the Y direction. Preferably, width W2 is greater than about 1.0 µm. The length L2 of strain bars 116 is preferably greater than a path of a detrimental stress applied to a channel of the MOS device. In an exemplary embodiment, the length L2 of strain bars 116 is greater than the width of gate strip 112, and preferably greater than length L1. Further, the left ends and the right ends of strain bars 116 preferably extend beyond the respective left end and right end of active region 110.

Figure 2:
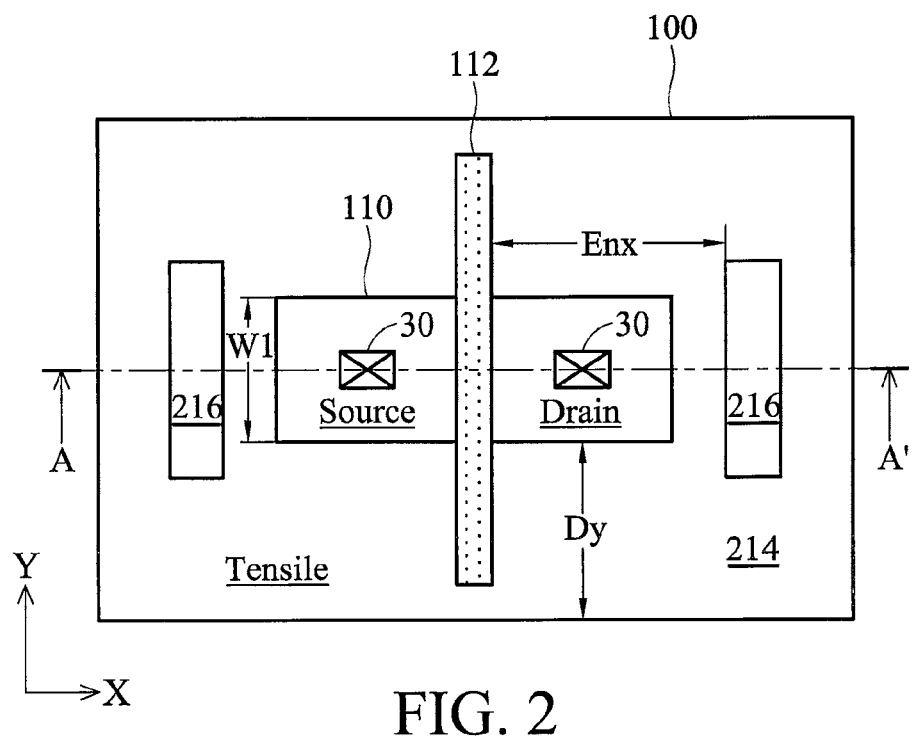
FIG. 2 illustrates strain bars formed in a tensile stressor layer over a PMOS device.

PMOS device 100 may also be covered by a stressor layer having an inherent tensile stress, as is shown in FIG. 2. Tensile stressor layer 214 applies tensile stresses to PMOS device 100 from both X and Y directions. Since the tensile stress in the channel width direction (Y direction) is beneficial for the performance of PMOS device 100, no strain bars are formed in the path of the inherent stress in the Y direction. On the other hand, since the tensile stress in the channel length direction (X direction) is detrimental to the performance of PMOS device 100, strain bars 216 are formed parallel to poly strip 112, and adjacent to the respective left and right edges of active region 110. Similarly, strain bars 216 are formed of a different material than that of stressor layer 214. Strain bars 216 advantageously result in the reduction in the tensile stress applied in the channel length direction of PMOS device 100. Preferably, distance Enx between strain bars 216 and the respective sidewall of gate strip 112 is preferably less than 1

μm, and more preferably less than about 0.3 μm, so that the effect of reducing the undesirable stress is maximized.

Figure 3A:
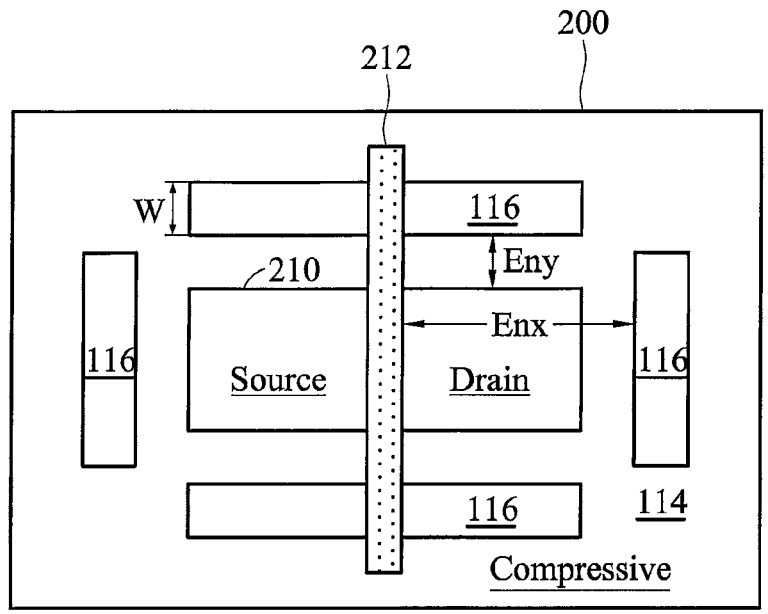
FIGS. 3A and 3B illustrate strain bars formed in a compressive stressor layer over an NMOS device.
Figure 3B:
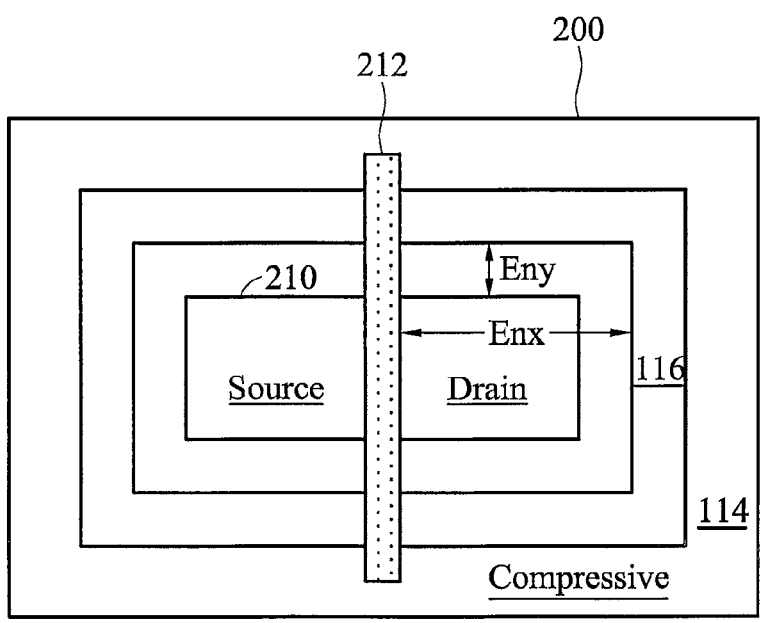
Figure 4:
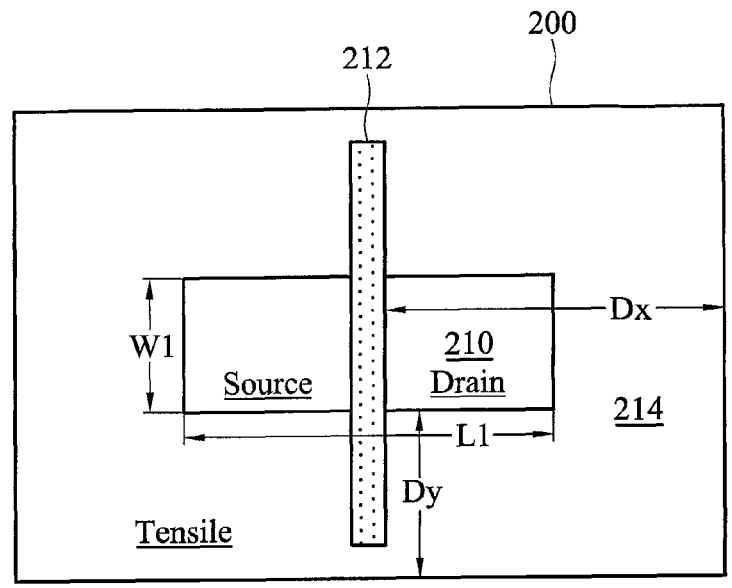
FIG. 4 shows no strain bars are formed in a tensile stressor layer over an NMOS device.

FIGS. 3A through 4 shows how strain bars are formed to improve the performance of NMOS devices. Referring to FIG. 3A, NMOS device 200 includes active region 210, and poly strip 212 over active region 210, wherein a portion of poly strip 212 acts as the gate of NMOS device 200. Compressive stressor layer 114 is formed over NMOS 200. Since the compressive stresses in both the channel length direction and the channel width direction are detrimental to the performance of NMOS device 200, strain bars 116 are formed in stressor layer 114 to reduce the inherent stresses in both X and Y directions in stressor layer 114. In FIG. 3A, strain bars 116 are discrete bars physically separated from each other. However, one or more adjacent strain bars 116 may be interconnected. An example is shown in FIG. 3B, wherein strain bars 116 are interconnected to form a strain bar loop. Similar to FIG. 1, strain bars 116 may be filled with ILDs, contact plugs, or dielectric materials having tensile or neutral stresses.

It is appreciated that due to geographical limitations, not all of the above-recited strain bars can be formed. This may occur, for example, if another MOS device occupies the location of a strain bar. The performance of the respective MOS devices, however, may still be improved with only part of the desirable strain bars formed, although in a reduced scale. For example, it is also possible to form only one strain bar in each of the structures shown in FIGS. 1 and 2. It is also possible to form only one, two, or three strain bars in FIG. 3A.

In FIG. 4, NMOS device 200 is covered with stressor layer 214, which has a tensile stress. Since NMOS device 200 prefers tensile stresses in both the channel length direction and the channel width direction, no strain bars are formed.

In the above-discussed embodiments, in the directions wherein strain bars are not formed, the stressor layers preferably extend far to strengthen the desirable stresses. For example, distances Dx and Dy (refer to FIGS. 1, 2, and 4) preferably have values greater than about 5 μm. In other words, in the directions the stressor film applies beneficial strains to the channel of the MOS device, there is no upper limit for the values of Dx and Dy in the respective direction.

Figure 5:
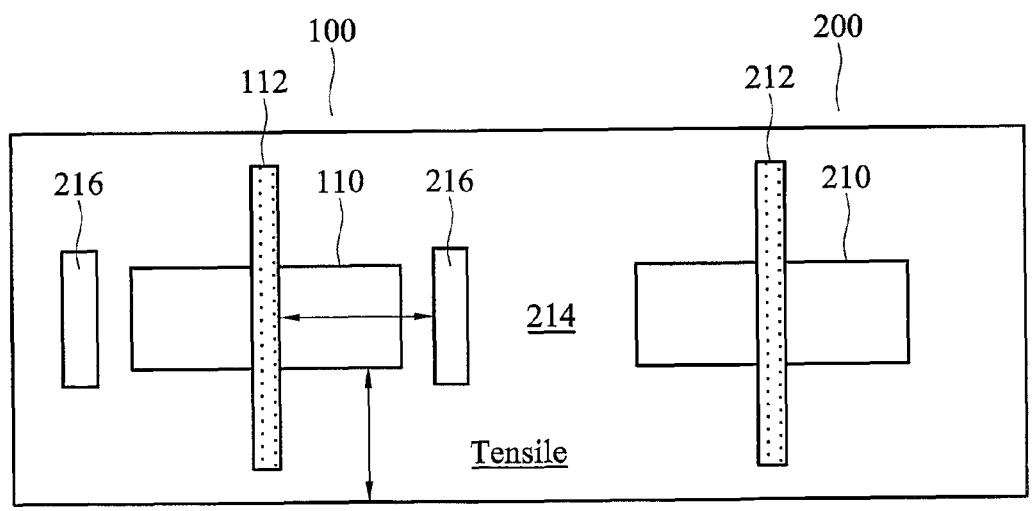
FIG. 5 illustrates a single-stressor scheme, wherein a same tensile stressor layer is formed over both PMOS and NMOS devices.
Figure 6:
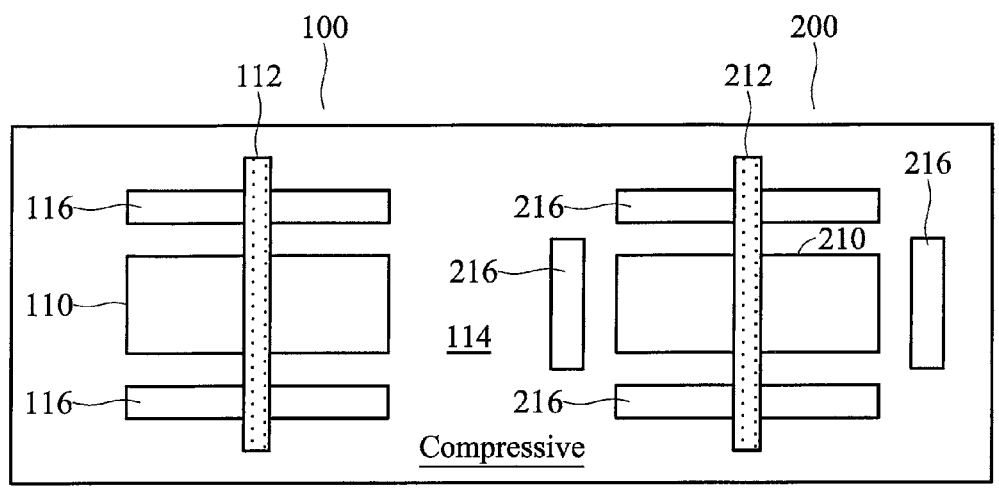
FIG. 6 illustrates a single-stressor scheme, wherein a same compressive stressor layer is formed over both PMOS and NMOS devices.

FIGS. 5 and 6 illustrate the strain bar formation for single-stressor schemes. FIG. 5 illustrates an embodiment in which a same tensile stressor layer 214 covers both PMOS device 100 and NMOS device 200. This embodiment is essentially the combination of the embodiments in FIGS. 2 and 4. FIG. 6 illustrates a single compressive stressor layer 114 formed on both PMOS device 100 and NMOS device 200. This embodiment is essentially the combination of the embodiments in FIGS. 1 and 3A.

In dual-stressor schemes, a compressive stressor layer is preferably formed over PMOS devices, and a tensile stressor layer is preferably formed over NMOS devices. Accordingly, the respective embodiments may be obtained by combining FIGS. 1 and 4.

Figure 7:
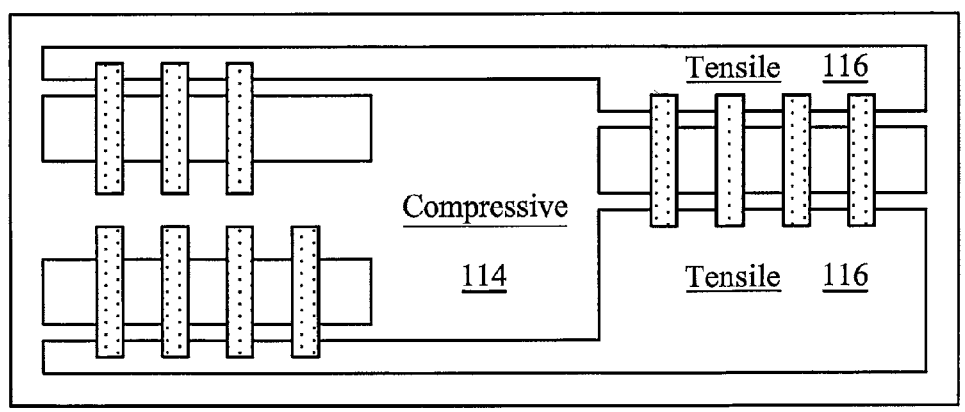
FIG. 7 illustrates strain bars having irregular shapes.

It is realized that although strain bars are shown as rectangular bars in FIGS. 1 through 6, they can have any shape, as long as they are formed in the path of the undesirable inherent stresses in the stressor layers. FIG. 7 illustrates exemplary irregularly shaped strain bars 116 formed in stressor layer 114. In this case, the strain bars of neighboring MOS devices are interconnected. Further, strain bars, instead of being formed on both sides of a MOS device, can be formed on only one side of the MOS device, as is also shown in FIG. 7.

Figure 8:
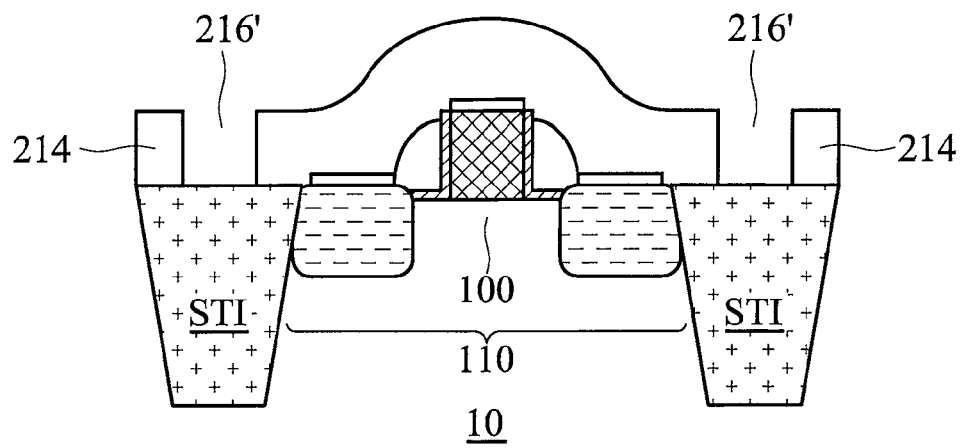
FIGS. 8 and 9 are cross-sectional views of intermediate stages in the formation of the structure shown in FIG. 2, wherein the strain bars are formed of an inter-layer dielectric.
Figure 9:
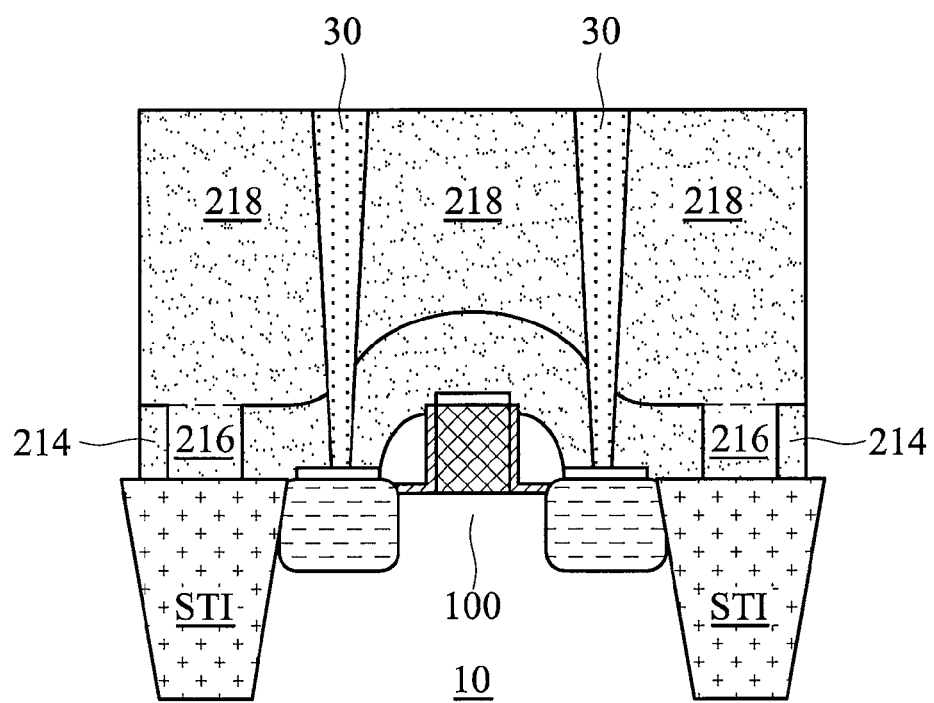

FIGS. 8 through 17 are cross-sectional views of the embodiments of the present invention, and are used to explain the formation processes of the embodiments discussed in the preceding paragraphs. FIGS. 8 and 9 illustrate cross-sectional views of intermediate stages in the formation of the structure shown in FIG. 2, wherein the cross-sectional views are taken along a plane crossing line A-A' in FIG. 2. Referring to FIG. 8, PMOS device 100 is formed, which active region 110 is defined by STI regions, wherein active region 110 includes a surface region of semiconductor substrate 10. Stressor layer 214 is formed to cover the entire PMOS device 100. Strain bar openings 216' are formed in stressor layer 214, for example, by etching. To form strain bar openings 216', an extra mask is needed. In FIG. 9, ILD 218 is formed, and strain bar openings 216' are filled with ILD 218. Next, contact openings are formed to penetrate ILD 218 and stressor layer 214, wherein stressor layer 214 may be used as a CESL. Contact plugs 30 are then formed in the contact openings. In this embodiment, the bottom portion of ILD 218 act as strain bars 216. Accordingly, the formation methods of strain bars 216 (and strain bars 116) may include sub-atmospheric pressure chemical vapor deposition (SACVD), high-density plasma (HDP), spin-on, and the like. The materials of the strain bars 216/116 thus may include commonly used ILD materials, such as carbon-containing low-k dielectrics, un-doped silicate glass (USG), and other dielectric materials.

Figure 10:
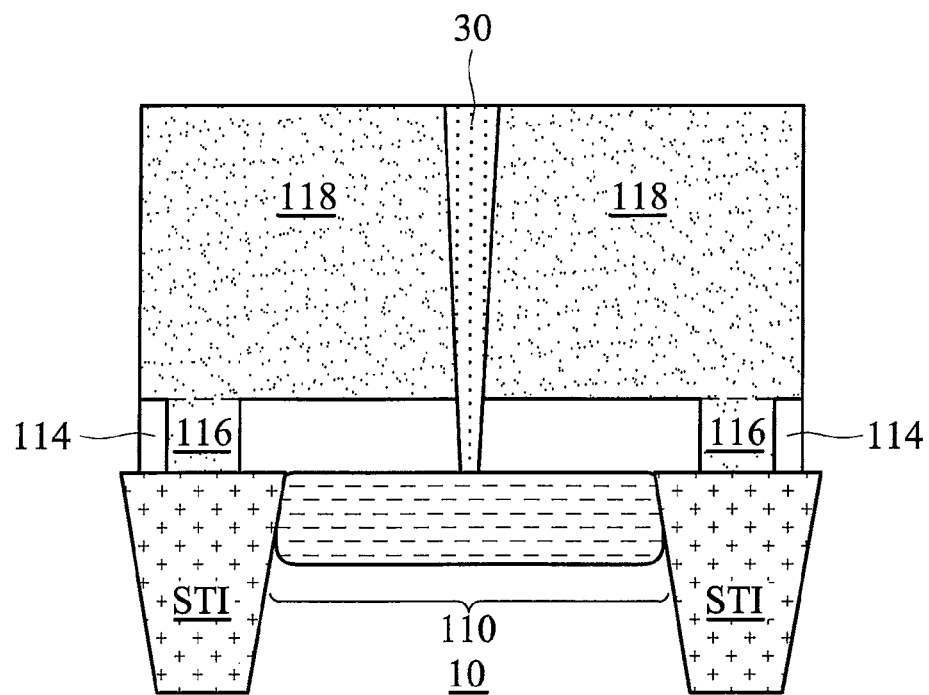
FIG. 10 is a cross-sectional view of the structure shown in FIG. 1.

FIG. 10 illustrates a cross-sectional view of the structure shown in FIG. 1, wherein the cross-sectional view is taken along a plane crossing line B-B'. Similar to the embodiment shown in FIGS. 8 and 9, strain bars 116 are also filled with ILD 118. Contact plugs 30 are formed to penetrate through ILD 118 and stressor layer 114.

Figure 11:
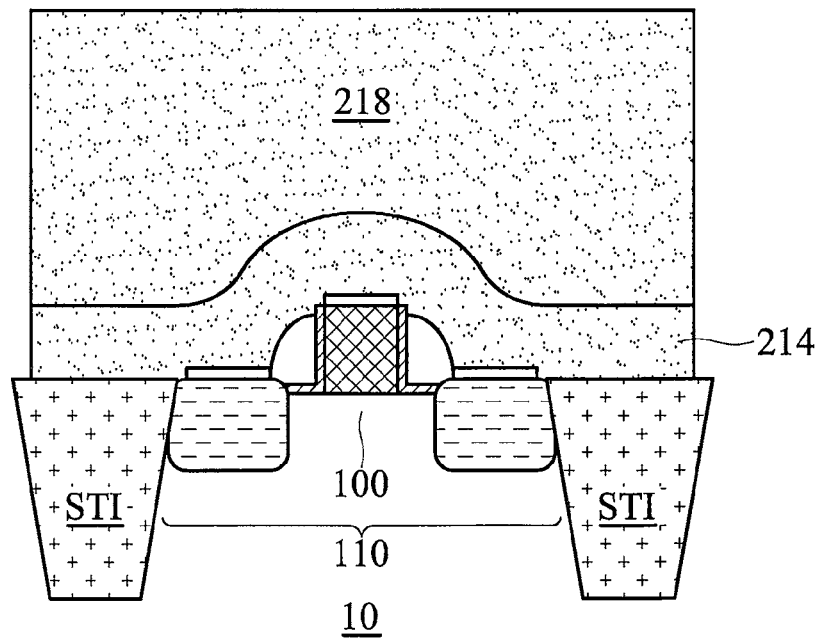
FIGS. 11 through 13 are cross-sectional views of intermediate stages in the formation of the structure shown in FIG. 2, wherein the strain bars are formed of a same material as contact plugs.
Figure 12:
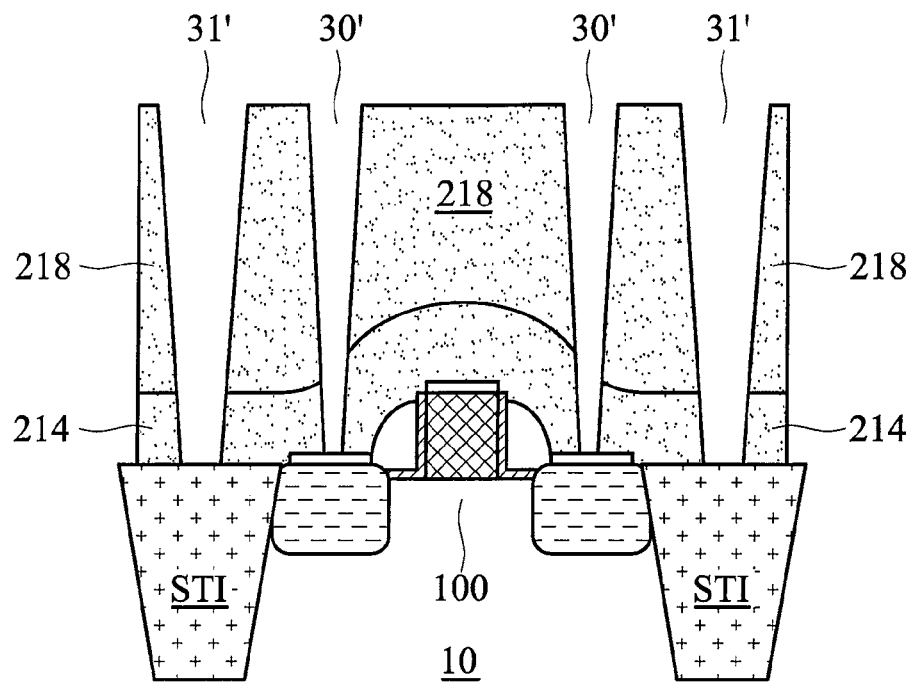
Figure 13:
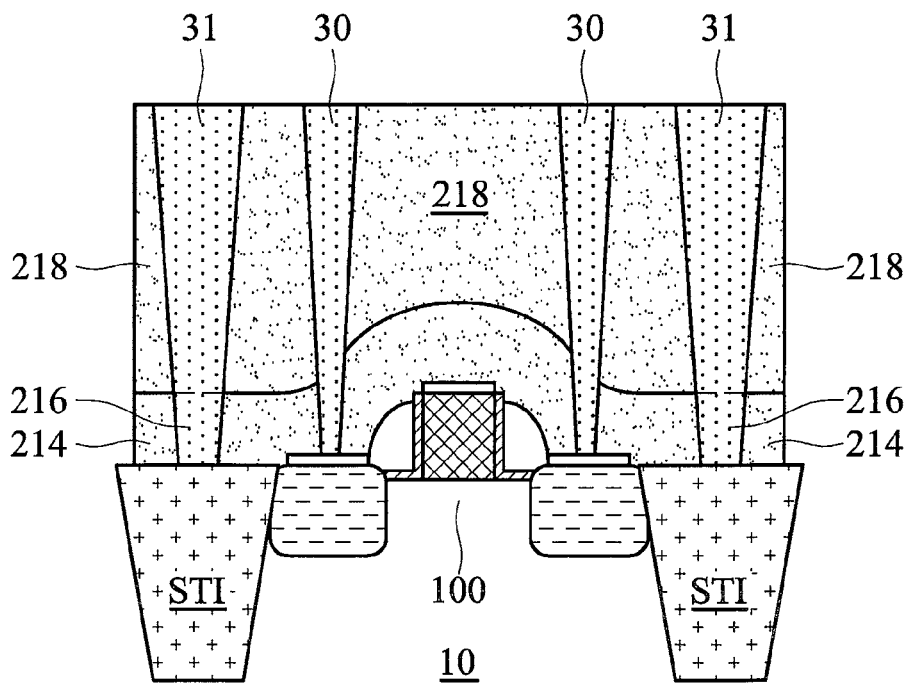

FIGS. 11 through 13 illustrate an alternative embodiment for forming the structure shown in FIG. 2, wherein the cross-sectional views are also taken along the plane crossing line A-A' in FIG. 2. Referring to FIG. 11, PMOS device 100 is formed, followed by the formation of stressor layer 214 and ILD 218. In FIG. 12, contact openings 30' and dummy contact openings 31' are simultaneously formed to penetrate ILD 218 and stressor layer 214. Dummy contact openings 31' are formed in the position of the desirable strain bars 216, as shown in FIG. 13, and hence land on STI regions. Referring to FIG. 13, contacts plugs 30 and dummy contact plugs 31 are formed. Dummy plugs 31 are preferably floating. The bottom portions of dummy plugs 31 in stressor layer 214 thus act as strain bars 216. Accordingly, strain bars 216 (and strain bars 116 in other embodiments) may include tungsten, aluminum, copper, tantalum, titanium, nitrides thereof, combination thereof, and multi-layers thereof. The applicable methods for strain bars 216 hence include physical vapor deposition (PVD), atomic layer deposition (ALD), sputtering, plating, and the like. Advantageously, in this embodiment, the formation of strain bars 216 requires no additional masks and no additional process steps.

Figure 14:
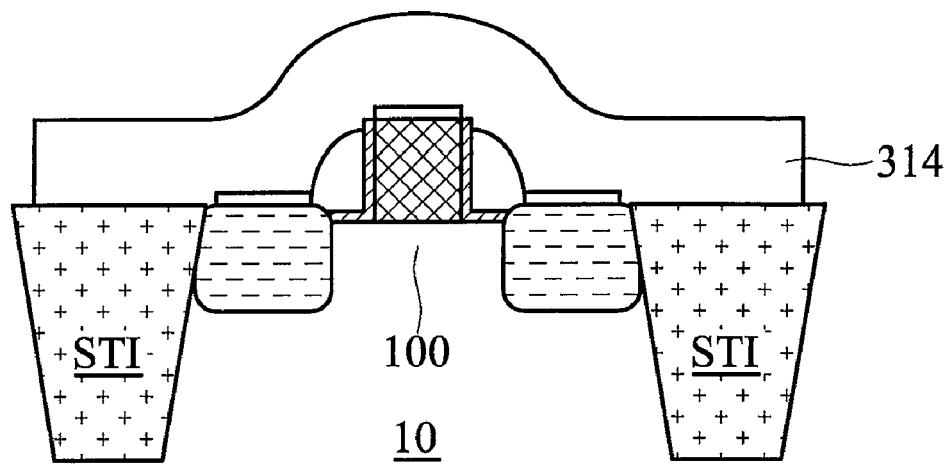
FIGS. 14 through 17 are cross-sectional views of intermediate stages in the formation of the structure shown in FIG. 2, wherein the strain bars are formed of a dielectric material having an opposite stress type than the stressor layer.
Figure 15:
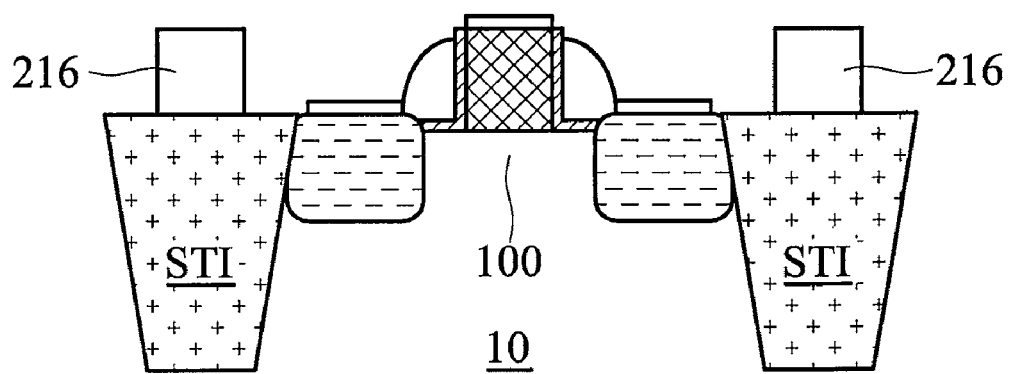
Figure 16:
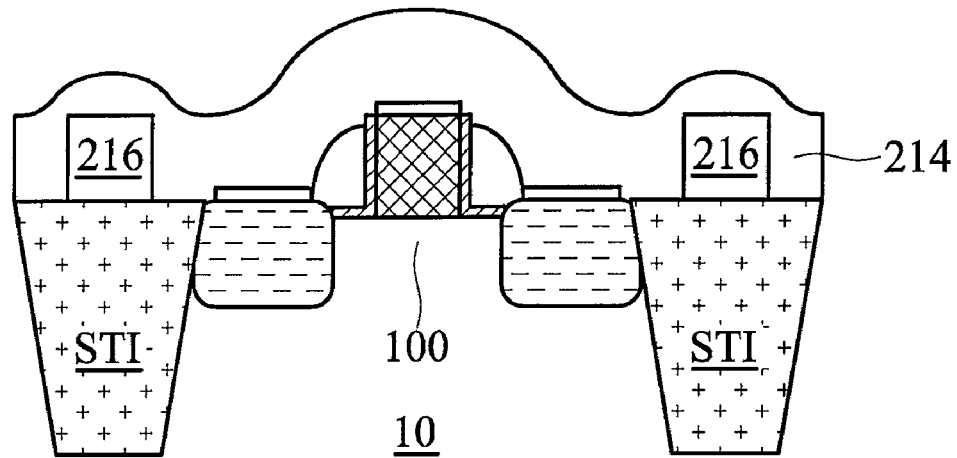
Figure 17:
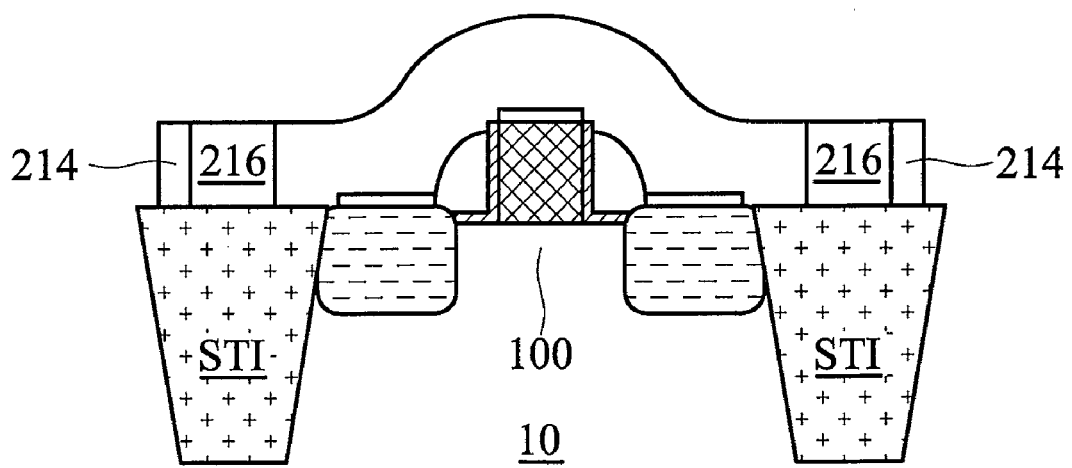

FIGS. 14 through 17 illustrate yet another embodiment, wherein the strain bars have an opposite stress type than the respective stressor layer. Again, the structure shown in FIG. 2 is used as an example, and the cross-sectional views are taken along line A-A'. Referring to FIG. 14, compressive stressor layer 314 is first formed over PMOS device 100. Next, as shown in FIG. 15, stressor layer 314 is patterned, and remaining portions form strain bars 216, which reside over the STI regions. In FIG. 16, tensile stressor layer 214 is blanket formed to cover PMOS device 100 and strain bars 216. A further patterning is then performed to remove the portions of stressor layer 214 directly overlying strain bars 216, resulting in a structure shown in FIG. 17. In the resulting structure, strain bars 216 have an opposite stress type than stressor layer 214, and hence are very effective in the reduction of detrimental stresses. However, this embodiment requires two extra masks, one for patterning stressor layer 314, and the other for patterning stressor layer 214.

Although FIGS. 8 through 17 only illustrate the process steps for forming some of the embodiments of the present invention, one skilled in the art will realize the process steps for forming remaining embodiments by applying the above-teachings, and selecting appropriate materials and patterns.

Strain bars 116 and 216 may be designed using logic operations, which may include layout modifications to graphic data system (GDS) files of the masks. For example, in the logic operations, MOS devices and the overlying CESL masks are first found, and the directions of the detrimental stresses applied by the CESL layers are determined. The appropriate locations and sizes of the strain bars are then determined, and the patterns of the strain bars are added to the masks. Alternatively, strain bars may be manually added. Preferably, the strain bars are formed directly over STI regions or field oxide regions, not directly over active regions. In alternative embodiments, the strain bars can also be formed directly over active regions.

Figure 18:
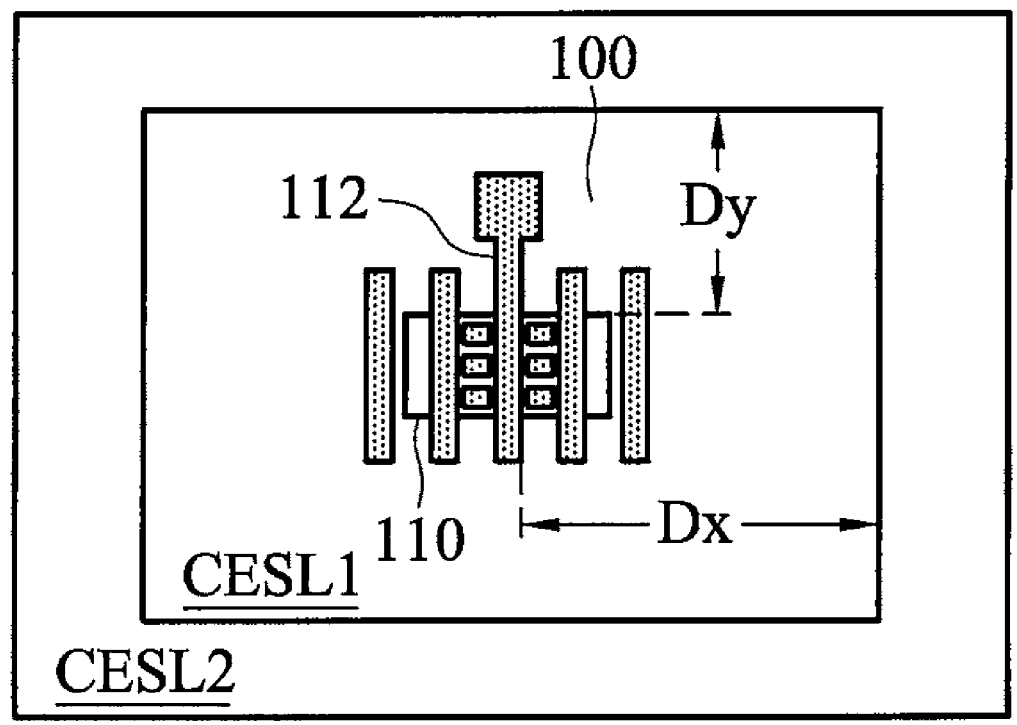
FIG. 18 shows a sample structure for experiments.
Figure 19:
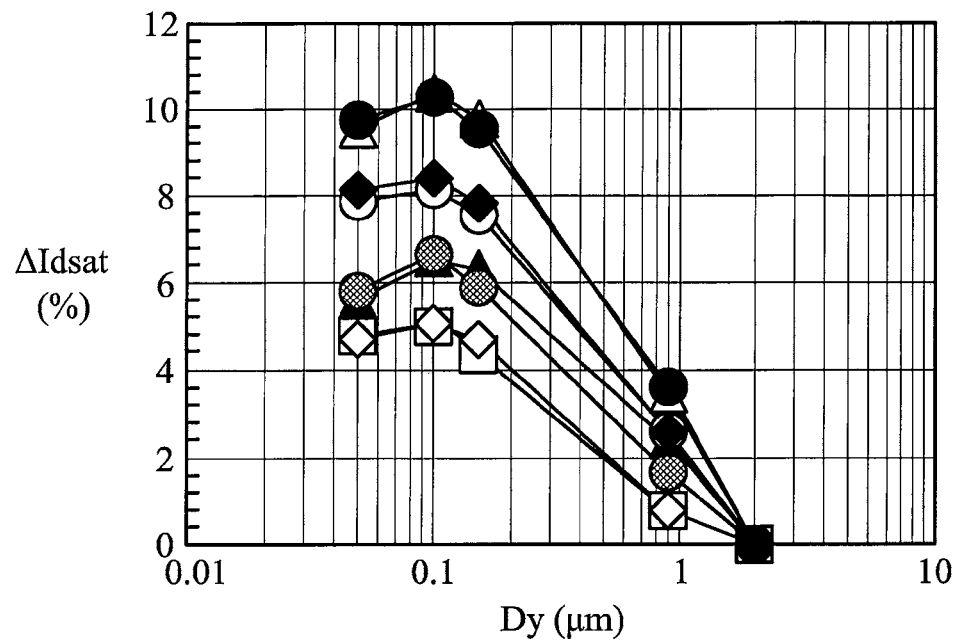
FIGS. 19 and 20 are experiment results indicating the effect of the sizes of the stressor layers.
Figure 20:
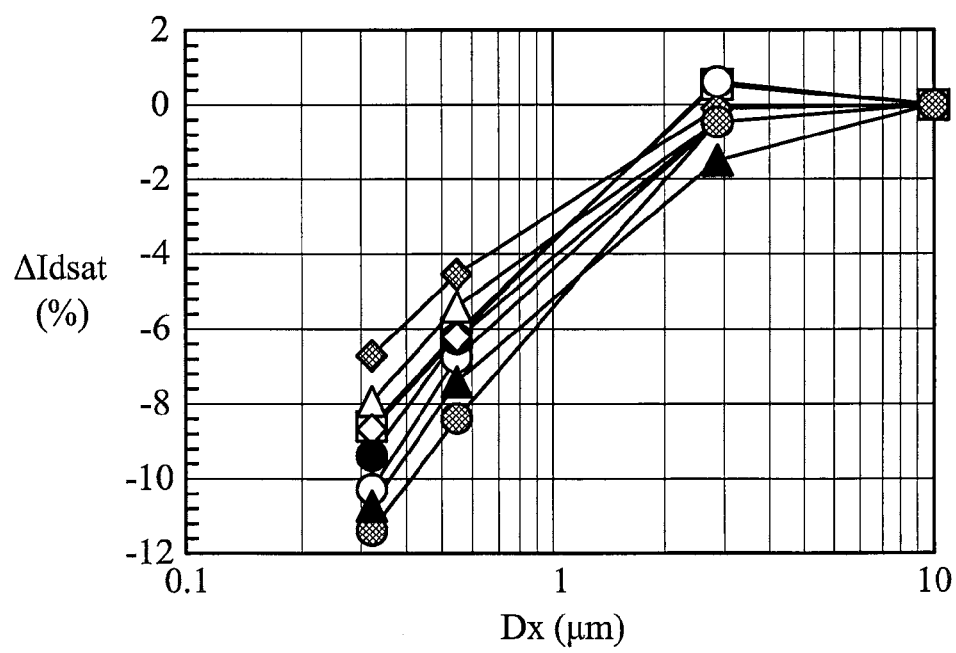

FIGS. 19 and 20 illustrate experiment results indicating the effect of sizes of stressor layers to the improvement of device performance. FIG. 18 illustrates the samples used in the experiments, which include PMOS device 100 (including poly strip 112 and active region 110) and compressive stressor layer CESL1 formed over PMOS device 100. Stressor layer CESL2, which encircles stressor layer CESL1, has a tensile stress. FIG. 19 illustrates the drive current increase (ΔIdsat, in percentage) as a function of distance Dy, which distance is shown in FIG. 18. Results from different samples are distinguished by the shapes. FIG. 19 reveals that in the direction detrimental stresses are applied, with the decrease in distance Dy, more drive current improvement is resulted, until at some distance (about 0.1 μm in these samples), the drive current improvement saturates. Therefore, strain bars are preferably formed close to the active regions.

FIG. 20 illustrates the drive current decrease (ΔIdsat, in percentage) as a function of distance Dx, which distance is also shown in FIG. 18. FIG. 20 reveals that in the direction beneficial stresses are applied, with the increase in distance Dx, less drive current degradation is resulted (or in other words, the drive current increases as a function of distance Dx), until at some distance (about 3.0 μm in these samples), the drive current degradation saturates. Therefore, no strain bars are formed in the directions beneficial stresses are applied.

By using the embodiments of the present invention, the detrimental stresses applied by the stressor layers are minimized, while the beneficial stresses provided by the same stressor layers are preserved. The performance of the MOS devices is thus improved. The embodiments of the present invention require minimal extra steps and masks, if at all, and thus the manufacturing cost is not substantially increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    an active region;
    a gate strip overlying the active region;
    a metal-oxide-semiconductor (MOS) device, wherein a portion of the gate strip forms a gate of the MOS device, and wherein a portion of the active region forms a source/drain region of the MOS device;
    a stressor region over the MOS device;
    a stressor-free region inside the stressor region and outside the region over the active region;
    an ILD over the stressor region; and
    a dummy contact plug extending into the ILD and into the stressor-free region.

2. The semiconductor structure of claim 1, wherein the stressor-free region is adjacent to an edge of the active region, and has a length greater than a path of a detrimental stress applied to a channel of the MOS device.

3. The semiconductor structure of claim 1, wherein the stressor-free region is in a path of a detrimental inherent stress in the stressor region, and wherein the stressor region is free from strain bars therein in paths of beneficial inherent stresses in the stressor region.

4. The semiconductor structure of claim 3, wherein the MOS device is a PMOS device, the stressor region has a compressive stress, and wherein the stressor-free region is in the path of a stress in a gate width direction of the MOS device.

5. The semiconductor structure of claim 3, wherein the MOS device is a PMOS device, the stressor region has a tensile stress, and wherein the stressor-free region is in the path of an inherent stress in a gate length direction of the MOS device.

6. The semiconductor structure of claim 3, wherein the MOS device is an NMOS device, the stressor region has a compressive stress, and wherein the stressor-free region is in the path of an inherent stress in a gate width direction of the MOS device.

7. The semiconductor structure of claim 6 further comprising an additional stressor-free region in the path of an inherent stress in a gate length direction of the MOS device.

8. A semiconductor structure comprising:
    a semiconductor substrate;
    an active region in the semiconductor substrate;
    an isolation region in the semiconductor substrate and adjoining the active region;
    a metal-oxide-semiconductor (MOS) device comprising:
        a gate electrode over the active region; and
        a source region and a drain region on opposing sides of the gate electrode, wherein the source and drain regions overlap portions of the active region;
    a stressor layer over the active region and the isolation region;
    a stressor-free region directly overlying the isolation region; and
    an inter-layer dielectric (ILD) over the stressor layer, wherein a portion of the ILD extends into the stressor-free region to form a first strain bar in the stressor-free region, and wherein a bottom surface of the portion of the ILD extends into the stressor-free region and contacts a top surface of the isolation region.

9. The semiconductor structure of claim 8, wherein the first strain bar and a nearest boundary of the active region has a distance of less than about 0.3 µm.

10. The semiconductor structure of claim 8, wherein the first strain bar has a stress type opposite to a stress type of the stressor layer.

11. The semiconductor structure of claim 8, wherein the first strain bar is substantially parallel to a nearest edge of the active region, and wherein the first strain bar has a length greater than about a path of a detrimental stress applied to a channel of the MOS device.

12. The semiconductor structure of claim 8 further comprising a second strain bar on an opposite side of the active region than the first strain bar, wherein the second strain bar is encircled by the stressor layer and directly over a second isolation region.

13. The semiconductor structure of claim 12 further comprising a third strain bar substantially perpendicular to the first and the second strain bars, wherein the third strain bar is encircled by the stressor layer and over a third isolation region.

14. The semiconductor structure of claim 12, wherein the first and the second strain bars form a closed loop with additional strain bars, and wherein the additional strain bars are encircled by the stressor layer and over a continuous isolation region comprising the first and the second isolation regions.

15. The semiconductor structure of claim 8, wherein the first strain bar and the stressor layer have a same stress type, with a stress of the first strain bar being smaller than a stress of the stressor layer.

16. A semiconductor structure comprising:
a semiconductor substrate;
an active region in the semiconductor substrate;
a shallow trench isolation (STI) region in the semiconductor substrate and adjoining the active region;
a metal-oxide-semiconductor (MOS) device comprising:
 a gate electrode over the active region; and
 a source region and a drain region on opposing sides of the gate electrode, wherein the source and the drain regions overlap portions of the active region;
a contact etch stop layer (CESL) over the active region and the STI region;
a stressor-free region overlying the isolation region, wherein the stressor-free region has a lengthwise direction perpendicular to a lengthwise direction of the gate electrode, and wherein no stressor-free region having a lengthwise direction parallel to the lengthwise direction of the gate electrode is formed adjacent the gate electrode;
a strain bar filling the stressor-free region;
an inter-layer dielectric (ILD) over the CESL; and
a contact plug in the ILD and contacting one of the source and drain regions.

17. The semiconductor structure of claim 16, wherein the ILD extends into the stressor-free region to form the strain bar.

18. The semiconductor structure of claim 17 further comprising a dummy contact plug in the ILD, wherein the dummy contact plug extends into the stressor-free region to form the strain bar.

19. The semiconductor structure of claim 16, wherein the ILD and the CESL have a same stress type, with a stress of the ILD being smaller than a stress of the CESL.

* * * * *